United States Patent
Jayaraman et al.

(10) Patent No.: US 10,714,893 B2
(45) Date of Patent: Jul. 14, 2020

(54) MID-INFRARED VERTICAL CAVITY LASER

(71) Applicants: Thorlabs, Inc., Newton, NJ (US); Praevium Research, Inc., Santa Barbara, CA (US)

(72) Inventors: Vijaysekhar Jayaraman, Goleta, CA (US); Kevin Lascola, Columbia, MD (US); Stephen Segal, Columbia, MD (US); Fredrick Towner, Fulton, MD (US); Alex Cable, Newton, NJ (US)

(73) Assignees: Thorlabs, Inc., Newton, NJ (US); Praevium Research, Inc., Santa Barbara, CA (US)

( * ) Notice: Subject to any disclaimer, the term of this patent is extended or adjusted under 35 U.S.C. 154(b) by 0 days.

(21) Appl. No.: 16/037,850

(22) Filed: Jul. 17, 2018

(65) Prior Publication Data
US 2019/0044304 A1 Feb. 7, 2019

Related U.S. Application Data

(60) Provisional application No. 62/533,501, filed on Jul. 17, 2017.

(51) Int. Cl.
*H01S 5/04* (2006.01)
*H01S 5/34* (2006.01)
(Continued)

(52) U.S. Cl.
CPC .............. *H01S 5/041* (2013.01); *G01J 3/42* (2013.01); *H01S 5/1838* (2013.01);
(Continued)

(58) Field of Classification Search
CPC .. H01S 5/3218; H01S 5/34366; H01S 5/3407; H01S 5/309; H01S 5/3216; H01S 5/3403; H01S 5/183; G01J 2003/423
See application file for complete search history.

(56) References Cited

U.S. PATENT DOCUMENTS

| 5,115,441 A | * | 5/1992 | Kopf | ............... | B82Y 20/00 |
| | | | | | 372/45.01 |
| 8,000,371 B2 | * | 8/2011 | Strittmatter | ............ | B82Y 20/00 |
| | | | | | 372/50.11 |

(Continued)

FOREIGN PATENT DOCUMENTS

| WO | 2003/058771 A2 | 7/2003 |
| WO | 2014/018942 A1 | 1/2014 |
| WO | 2014/018945 A1 | 1/2014 |

OTHER PUBLICATIONS

W.W. Bewley et al., "Room-temperature Mid-Infrared Interband Cascade Vertical Cavity Surface Emitting Lasers,"; Applied Physics Letters 109, (2016), pp. 151108-1 to 151108-5.

(Continued)

*Primary Examiner* — Tuan N Nguyen
(74) *Attorney, Agent, or Firm* — Myers Wolin, LLC

(57) ABSTRACT

Disclosed is an optically pumped vertical cavity laser structure operating in the mid-infrared region, which has demonstrated room-temperature continuous wave operation. This structure uses a periodic gain active region with type I quantum wells comprised of InGaAsSb, and barrier/cladding regions which provide strong hole confinement and substantial pump absorption. A preferred embodiment includes at least one wafer bonded GaAs-based mirror. Several preferred embodiments also include means for wavelength tuning of mid-IR VCLs as disclosed, including a MEMS-tuning element. This document also includes systems for optical spectroscopy using the VCL as disclosed, including systems for detection concentrations of industrial and environmentally important gases.

34 Claims, 6 Drawing Sheets

(51) Int. Cl.
H01S 5/183 (2006.01)
H01S 5/343 (2006.01)
G01J 3/42 (2006.01)
H01S 5/32 (2006.01)

(52) U.S. Cl.
CPC ........ *H01S 5/18361* (2013.01); *H01S 5/3218* (2013.01); *H01S 5/3403* (2013.01); *H01S 5/34306* (2013.01); *H01S 5/34366* (2013.01); *G01J 2003/423* (2013.01); *H01S 5/18358* (2013.01); *H01S 5/18366* (2013.01); *H01S 5/18377* (2013.01); *H01S 5/18383* (2013.01)

(56) References Cited

U.S. PATENT DOCUMENTS

| | | | |
|---|---|---|---|
| 2002/0025590 A1* | 2/2002 | Hall .................. | B82Y 20/00 438/29 |
| 2003/0164503 A1* | 9/2003 | Chen .................. | H01L 33/405 257/79 |
| 2004/0135136 A1* | 7/2004 | Takahashi .......... | B82Y 20/00 257/14 |
| 2005/0173694 A1 | 8/2005 | Mawst et al. | |
| 2015/0270677 A1* | 9/2015 | Topper ................ | H01S 3/0604 372/34 |
| 2017/0117684 A1* | 4/2017 | Garnache-Creuillot ..................... H01S 5/041 |

OTHER PUBLICATIONS

G.K. Veerabathran et al., "Room-temperature vertical cavity surface emitting lasers at 4um with GaSb-based type II quantum wells,"; Applied Physics Letters 110, (2017), pp. 071104-1 to 071104-5.

G. Belenky et al.,"Type-I Diode Lasers for Spectral Region Above 3 μm," IEEE Journal of Selected Topics in Quantum Electronics, vol. 17. No. 5, Sep./Oct. 2011, pp. 1426-1434.

H. Kroemer, "The 6.1 Angstrom family (GaSb, InAs, AlSb) and its heterostructures: a selective review," Physica E, 20 (2004), pp. 196-203.

I. Vurgaftman et al., "Band Parameters for III-V compound semiconductors and their alloys," Journal of Applied Physics, vol. 89, No. 11, Jun. 1, 2001, pp. 5815-5875.

G.D. Cole et al.,"High performance near- and mid-infrared crystalline coatings," Optica vol. 3, No. 6, Jun. 2016, pp. 647-656.

W. Drexler et al., "Optical Coherence Tomography: Principles and Applications," 2nd edition, chapter 23, 2015, 2 pages.

W.W. Bewley et al; "Room-temperature Mid-Infrared Interband Cascade Vertical Cavity Surface Emitting Lasers,"; Applied Physics Letters 109, 151108 (2016).

G.K. Veerabathran, et al; "Room-temperature vertical cavity surface emitting lasers at 4um with GaSb-based type II quantum wells,"; Applied Physics Letters 110, 071104, (2017).

G. Belenky, et al,"Type I Diode Lasers for Spectral Region Above 3.0um," IEEE Journal of Selected Topics in Quantum Electronics, vol. 17. No. 5, Sep./Oct. 2011.

H. Kroemer, "The 6.1 Angstrom family (GaSb, InAs, AlSb) and its heterostructures: a selective review," Physica E, 20 (2004), 196-203.

I. Vurgaftmann, et al, "Band Parameters for III-V compound semiconductors and their alloys," Journal of Applied Physics, vol. 80, no. 11, Jun. 1, 2001.

G.D. Cole et al,"High performance near- and midinfrared crystalline coatings," Optica vol. 3, issue 6, pp. 647-656 (2016).

VCSEL "Widely Tunable VCSEL Fabrication" VJ chapter 23 Oct. (and MEMS-VCSEL fabrication).

International search report and written opinion issued for corresponding International Patent Application No. PCT/US2018/042512, dated Oct. 25, 2018.

* cited by examiner

US 10,714,893 B2

MID-INFRARED VERTICAL CAVITY LASER

CROSS REFERENCE TO RELATED APPLICATIONS

This application claims the benefit of U.S. Provisional Patent Application No. 62/533,501 filed on Jul. 17, 2017. The contents of U.S. Provisional Patent Application 62/533,501 are hereby incorporated by reference.

STATEMENT REGARDING FEDERALLY SPONSORED RESEARCH OR DEVELOPMENT

This invention was made with Government support under contract number DE-AR0000538 awarded by DOE, office of ARPA-E. The Government has certain rights in this invention.

FIELD OF THE INVENTION

This invention relates generally to mid-infrared semiconductor lasers, and more particularly to tunable mid-infrared semiconductor lasers, and vertical cavity lasers.

BACKGROUND

Achieving room-temperature continuous-wave (RTCW) vertical cavity laser (VCL) operation at wavelengths beyond about 3.0 microns (um) presents severe challenges. As of June 2017, electrically pumped VCLs (eVCLs) employing type II interband cascade laser (ICL) technology, though promising, had achieved only room temperature pulsed operation above 3.0 um. Two state of the art results are described in "Room-temperature Mid-Infrared Interband Cascade Vertical Cavity Surface Emitting Lasers," by W. W. Bewley et al in *Applied Physics Letters* 109, 151108 (2016), and in "Room-temperature vertical cavity surface emitting lasers at 4 um with GaSb-based type II quantum wells," by G. K. Veerabathran, et al in *Applied Physics Letters* 110, 071104 (2017). Achieving RTCW operation in ICL eVCLs will require further reduction of operating voltages, and/or reduced optical losses.

If alternative type I InGaAsSb quantum wells for eVCLs are employed, a different set of challenges emerges. The band line-up of type I quantum wells with either AlGaAsSb or AlInGaAsSb barriers lattice-matched to GaSb leads to increasingly poor hole confinement with increasing wavelength, resulting in reduced material gain and reduced maximum operating temperature. This challenge is described in "Type I Diode Lasers for Spectral Region Above 3.0 um," by G. Belenky, et al, *IEEE Journal of Selected Topics in Quantum Electronics*, vol. 17. No. 5, September/October 2011. This problem is even more severe in VCLs than in edge-emitting lasers, since VCLs have short gain length and generally worse thermal impedance than edge-emitters. Thus, RTCW operation has also not yet been achieved beyond 3.0 um in VCLs employing type I quantum wells.

From the foregoing, it is clear that what is required is a vertical cavity laser structure operating at a wavelength >3.0 um, which is capable of room temperature continuous wave operation.

SUMMARY

An embodiment of the present invention describes the first RTCW VCL structure operating at wavelengths greater than 3.0 um. An embodiment of the present invention employs type I compressively strained quantum wells comprising Indium, Arsenic, and Antimony in an optically pumped structure to achieve RTCW VCL operation. Ideally the structure employs periodic gain, by which it is meant a structure in which at least one quantum well is substantially aligned with a peak in the optical standing wave. Periodic gain typically includes structures with multiple quantum wells substantially aligned with multiple standing wave peaks. This optically pumped VCL structure offers several advantages. First, optical pumping requires no dopants in the optical cavity, eliminating free carrier absorption, which is the primary source of loss in eVCLs. This also enables consideration of a wider range of materials than available to eVCLs, such as materials which cannot be efficiently doped. Secondly, the periodic gain structure, ideal for optical pumping, but difficult to implement in electrical pumping, maximizes effective gain, since all quantum wells can be positioned very close to a peak in the optical standing wave. Periodic gain also alleviates strain accumulation, enabling the use of a larger number of widely separated highly compressively strained quantum wells for higher gain than electrically pumped type I structures.

An embodiment of the present invention employs a barrier and cladding designed to maximize hole confinement in the InGaAsSb quantum wells. This barrier/cladding is AlInGaAsSb/AlAsSb in one preferred embodiment, pure GaSb in another preferred embodiment, and pure AlAsSb in another embodiment.

Further embodiments of the present invention include a tuning mechanism integrated into the laser cavity to shift the lasing wavelength. This tuning mechanism can employ thermal tuning and also micro-electromechanical systems (MEMS) tuning. Tunable VCLs in the 3-5 um range have a numerous applications in the detection of a variety of species, particularly in gas detection. An embodiment of the present invention includes systems for optical spectroscopy based on the VCL disclosed in this document. In these systems, tunable VCL emission having a first wavelength dependence interacts with a sample to create a transformed wavelength dependence, which can be related to a property of the sample.

One embodiment of the present invention provides an optically pumped vertical cavity laser (VCL) optically pumped with a pump source at a pump wavelength and providing VCL emission at an emission wavelength, said VCL including a first mirror, a second mirror, and a periodic gain active region, wherein said periodic gain active region includes at least two type I quantum wells containing Indium, Arsenic, and Antimony, said active region further including a barrier region adjacent to said type I quantum wells which is absorbing at said pump wavelength, and a cladding region adjacent to said barrier region, which is substantially transparent at said pump wavelength.

Another embodiment of the present invention provides a vertical cavity laser (VCL) optically pumped with a pump source at a pump wavelength, said VCL including a first mirror, a second mirror, and a periodic gain active region, wherein said periodic gain active region includes at least two type I quantum wells containing Indium, Arsenic, and Antimony, said active region further including a GaSb barrier region adjacent to said type I quantum wells.

Another embodiment of the present invention provides an optically pumped vertical cavity laser (VCL) optically pumped with a pump source at a pump wavelength and providing VCL emission at an emission wavelength, said VCL including a first mirror, a second mirror, and a periodic gain active region, wherein said periodic gain active region includes at least two type I quantum wells containing Indium, Arsenic, and Antimony, and at least one of said first and second mirrors comprises GaAs.

DETAILED DESCRIPTION OF THE PREFERRED EMBODIMENTS

Figure 1:
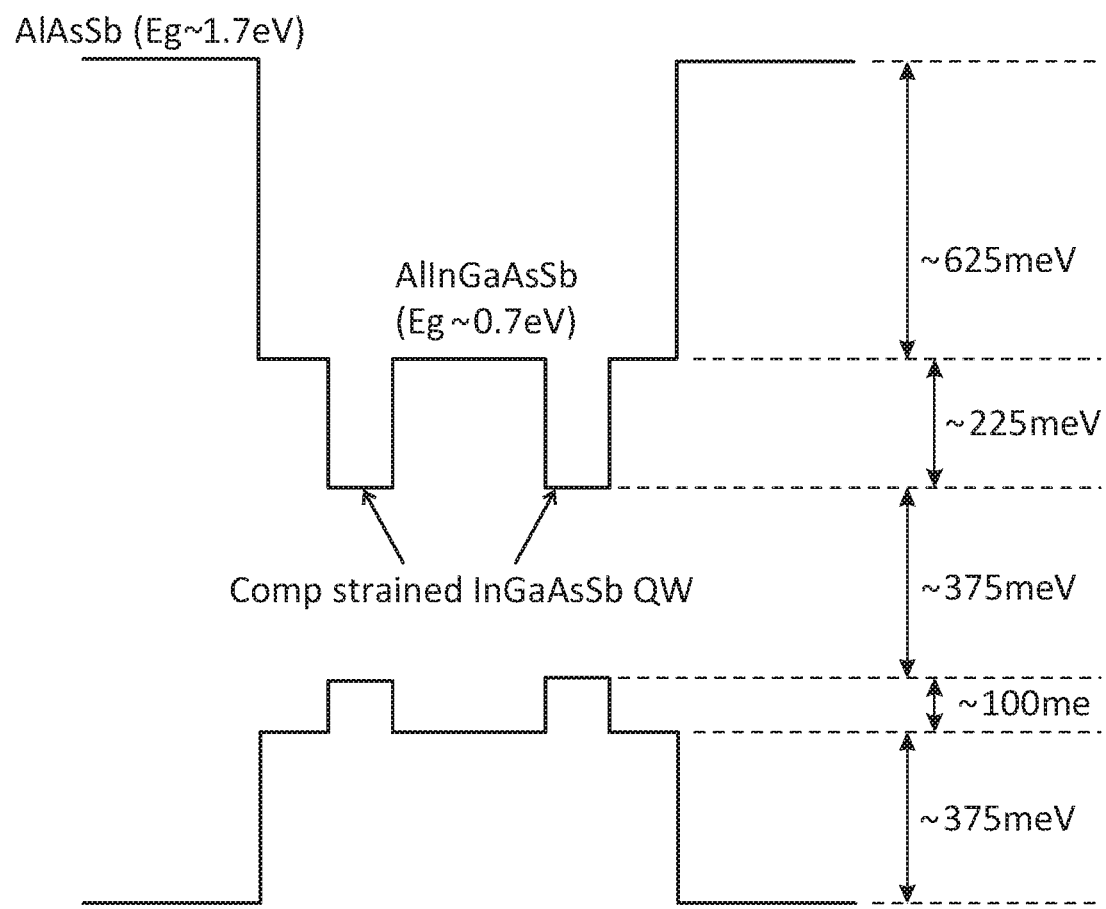
FIG. 1 is band lineup of various materials lattice matched or nearly lattice matched to GaSb, illustrating hole and electron confinement according to an embodiment of the present invention.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

In the preferred embodiment of the present invention, the operating wavelength of the VCL is 3-5 um. Preferably, 6-12 compressively strained (1-2% strain) InGaAsSb quantum wells are employed, with pairs of quantum wells at 3-6 standing wave peaks in the optical cavity. The InGaAsSb quantum wells are adjacent to a wider bandgap barrier layer, and the barrier layer is adjacent to a still wider bandgap cladding layer. In the preferred embodiment, the barrier layer is quinary AlInGaAsSb substantially lattice-matched to GaSb, and the cladding layer is AlAsSb substantially lattice-matched to GaSb. The AlInGaAsSb absorbs a preferred pump wavelength in the range of 1.55 um, while AlAsSb is transparent to this pump wavelength and also serves as a hole blocking layer, as discussed further below. The amount of quinary material is preferably adjusted to obtain a single-pass absorption efficiency of the active region of about 40-80% of the pump light, giving efficient use of pump energy in combination with relatively uniform pumping of quantum wells. Note that although InGaAsSb is the preferred well composition, InAsSb or other compounds may also be employed to obtain longer wavelengths closer to 5 um.

In an alternate preferred embodiment, the InGaAsSb quantum wells are clad by pure GaSb layers, which can provide good hole confinement and thermal conductivity. Achieving this alternate embodiment, however, requires low temperature growth to overcome strain limitations. Alternately the quantum wells can be clad directly by AlAsSb, without an intermediate AlInGaAsSb layer. This implementation is less preferred as the wide bandgap AlAsSb does not absorb pump wavelengths near 1.55 um, and absorption will occur only in the quantum wells, reducing absorption efficiency and increasing required threshold power. In yet another embodiment, the AlAsSb cladding could be eliminated, leaving only the AlInGaAsSb barrier. This approach has the disadvantage of increasingly poor hole confinement when moving to wavelengths substantially longer than about 3.0 um.

In the preferred embodiment, the presence of AlAsSb provides additional hole confinement, as shown by the band diagram of FIG. 1. Although heterostructure band offsets for materials lattice matched or nearly lattice-matched to GaSb are not precisely known, reasonable estimates can be made based on the literature, from which qualitative conclusions can be drawn. FIG. 1 shows estimated band offsets between strained InGaAsSb quantum wells, an adjacent AlInGaAsSb quinary barrier region, and an AlAsSb cladding region. These offsets are estimated from "The 6.1 Angstrom family (GaSb, InAs, AlSb) and its heterostructures: a selective review," by H. Kroemer in *Physica E*, 20 (2004), 196-203, and from "Band Parameters for III-V compound semiconductors and their alloys," by I. Vurgaftmann, et al in *Journal of Applied Physics*, vol. 80, no. 11, Jun. 1, 2001. Despite some uncertainty in band offset values, the primary point of FIG. 1 is that the AlAsSb serves as a hole blocking layer, increasing the confinement of holes more than that provided by the quinary AlInGaAsSb barrier alone.

The 1.55 um pump wavelength is preferred, as cost-effective pump lasers are widely available at this wavelength, and in the range of about 1.45-1.65 um. This wavelength is also preferred because it will be absorbed by quinary AlInGaAsSb lattice-matched to GaSb, which is the preferred barrier material. Alternate pump wavelengths in the ranges of about 0.95-1.15 um and 1.7-2.1 um could be used in alternate preferred embodiments. The use of 6-12 quantum wells (approximate width 9 nm) with AlInGaAsSb barriers (50 nm width) and 1.55 um range pumping in this design provides both adequate gain and adequate absorption length, enabling efficient use of available pump power. Note that pumping at a longer wavelength that is transparent to the AlInGaAsSb barrier, such as 2.1 um, though having less absorption, does have the advantage of less heating for a given amount of absorbed power, resulting in higher output power when sufficient pump power is available.

In the preferred embodiment, the VCL uses at least one wafer-bonded mirror containing $Al(x)Ga(1-x)As$, where $0 \leq x \leq 1$, grown on a GaAs substrate. GaAs-based mirrors composed of alternating quarter wave layers of GaAs/AlGaAs are known to have very low mid-infrared loss, as discussed in "High performance near- and mid-infrared crystalline coatings," by G. D. Cole et al, *Optica* vol. 3, issue 6, pp. 647-656 (2016). These mirrors also have large refractive index contrast, correspondingly large bandwidth, are transparent to pump wavelengths >0.9 um, and have excellent thermal conductivity, as is well-known to those skilled in the art of NIR VCLs. Additionally, these mirrors can be grown with the requisite large thicknesses and high surface quality on large 4 to 6-inch substrates, so are commercially attractive for volume production of mid-IR VCLs. Alternate preferred embodiments, however, could use either epitaxially grown or wafer-bonded mirrors grown on GaSb substrates, such as alternating layers of GaSb/AlAsSb, which also provide high refractive index contrast. The GaSb in the mirror, however, would absorb the preferred pump wavelength of 1.55 um, reducing pump efficiency as well as increasing free-carrier loss in the mirror as the pump is absorbed and free-carriers are generated. As another preferred embodiment, deposited mirrors such as Germanium/Zinc Sulfide (Ge/ZnS), or mirrors employing ZnSe, ThF4, CaF2, or Si could be used on one or both sides of the optical cavity.

Figure 2A:
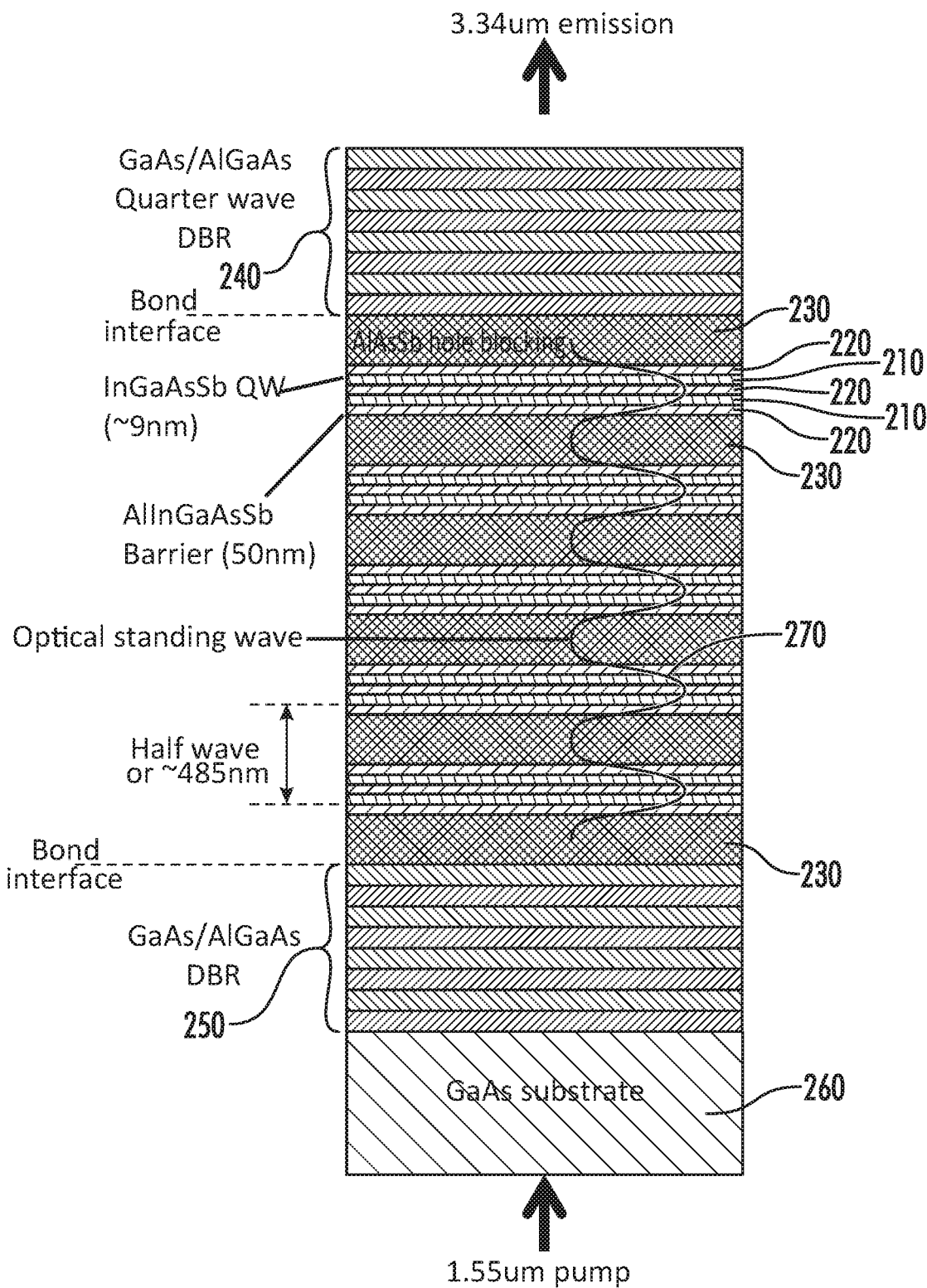
FIG. 2A shows a laser structure according to a preferred embodiment of the present invention.
Figure 2B:
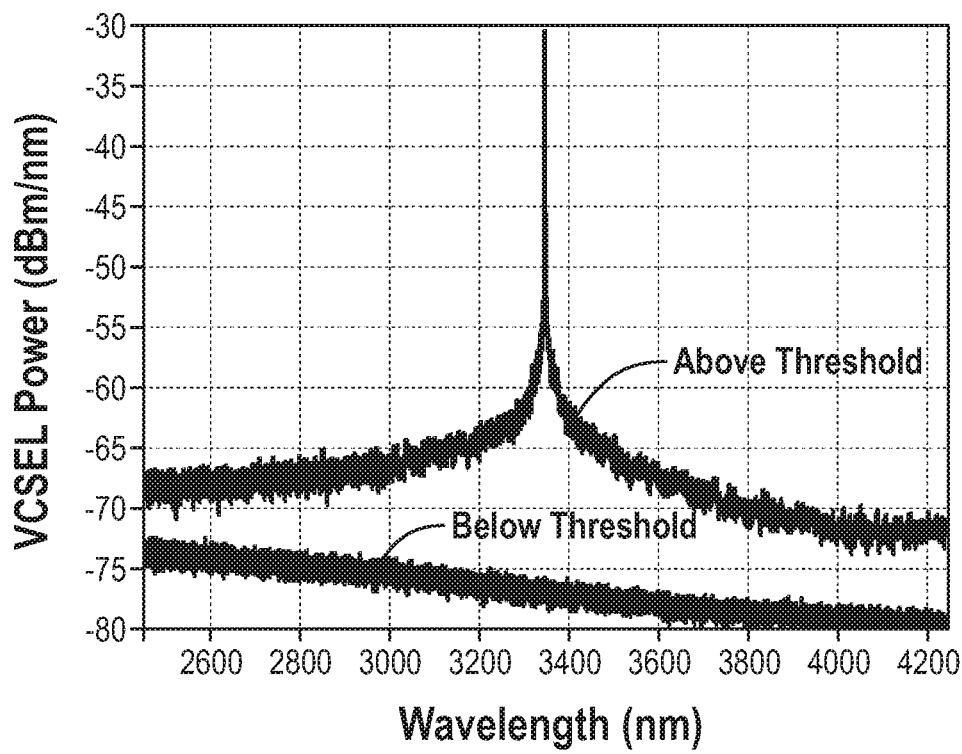
FIGS. 2B and 2C show the RTCW laser results of this embodiment.
Figure 2C:
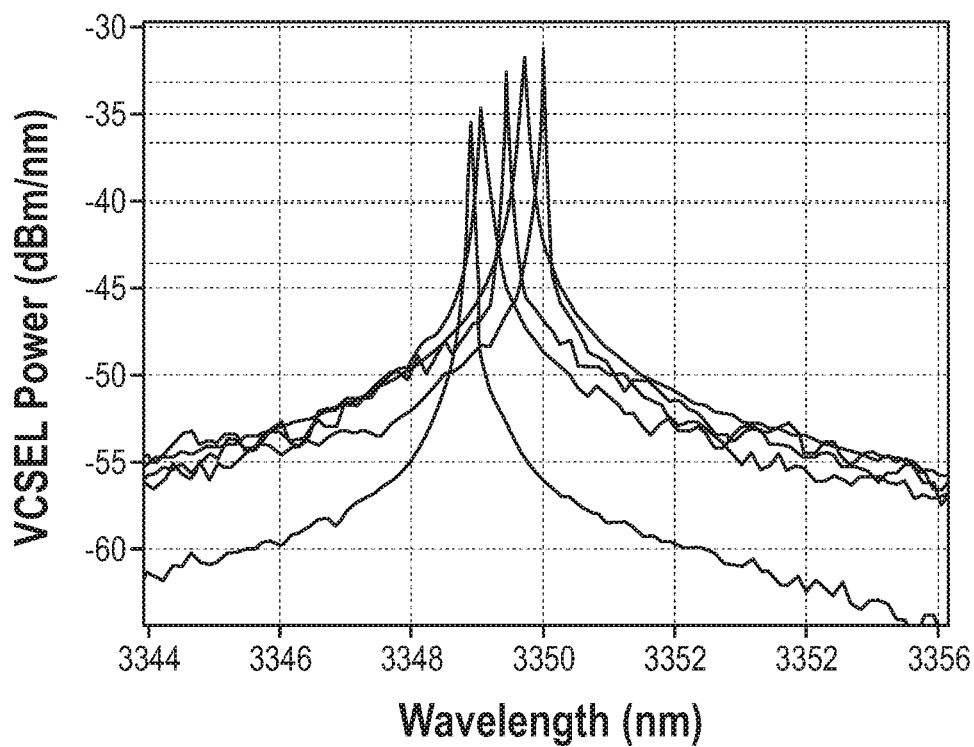

FIGS. 2A-2C show a reduction to practice of a preferred embodiment of the present invention, demonstrating RTCW operation near 3.349 um. As seen in FIG. 2A, the active region of the structure in this embodiment uses 5 pairs of compressively strained (1-2%) quantum wells 210 (about 9 nm thickness) with an approximate composition of $In(0.55)Ga(0.45)As(0.26)Sb(0.74)$ on 5 peaks of a standing wave 270. Quinary barriers 220 (about 50 nm) with an approximate composition of $Al(0.22)Ga(0.46)In(0.32)As(0.3)Sb(0.7)$ surround the InGaAsSb quantum wells, and absorb 1550 nm (1.55 um) pump radiation. Lattice matched AlAsSb cladding regions 230, which are transparent to 1550 nm light, provide additional hole confinement. The distance between pairs of wells is one half wavelength or approximately 485 nm. The laser employs a GaAs/AlGaAs quarter wave wafer-bonded distributed Bragg reflector (DBR) mirror 240, 250 on either side of the active region. An optical pump beam at 1.55 um enters through the GaAs substrate 260 and the 3.349 um emission emerges through the opposite side of the structure.

In alternate preferred embodiments described above, the AlInGaAsSb and AlAsSb in FIG. 2A could be replaced by either pure GaSb or pure AlAsSb. This would require either low-temperature growth due to increased strain (pure GaSb) or higher pump power due to reduced absorption (pure AlAsSb).

As shown in FIGS. 2B and 2C, the emission in this structure is single-wavelength, representing a single transverse and longitudinal mode. FIG. 2B illustrates the trace provided by an FTIR optical spectrum analyzer (OSA) both above and below threshold, illustrating a clear lasing peak above threshold and only OSA noise below threshold. FIG. 2C shows thermal tuning of the lasing wavelength as the pump power is varied. This device employs a shallow annular etch of approximately 20 um inner diameter at the wafer-bonded interface, to provide refractive index guiding.

The near field spot size needed to achieve efficient single-mode operation should preferably be in a range of about 8-26 um for emission in the range of 3.34 um. This lateral beam dimension roughly scales with wavelength, and the ideal single-mode beam size should be in the range of about 2.5-7 times the emission wavelength. The lateral mode field diameter can be controlled in a manner analogous to NIR VCSELs, using etched post or oxide confined geometries, as is well-known to those skilled in the art of VCSELs.

The structure of FIG. 2A can be fabricated according to an embodiment as follows. First the GaAs/AlGaAs DBR mirrors are grown on a GaAs substrate. In addition, the 10 QW periodic gain active region is separately grown on a GaSb substrate, and includes an InAsSb stop-etch layer to aid subsequent substrate removal. The DBR mirror and active region can be joined by plasma-activated low temperature bonding, as is well-understood by those skilled in the art of wafer bonding. In this process both the GaAs surface and GaSb surface at the bond interface are plasma activated using an oxygen plasma, and two wafers are joined with the aid of a small amount of $H_2O$ at the bond interface to create an oxide bond. This oxide may be an oxide of gallium, arsenic, indium, or antimony. An interfacial $Al_2O_3$ or $SiO_2$ layer can also be introduced at the interface to increase bond strength. The bond forms over several hours at room temperature, and subsequent annealing at 100-200° C. can increase bond strength. An alternate bonding method is to use metal bonding, such as gold-gold bonding with an aperture in the metal to allow for light passage. After bond formation, the GaSb substrate can be removed using well-known mixtures of $HF/CrO_3$, stopping on an InAsSb stop-etch layer. A mixture of 2:1 citric acid:hydrogen peroxide can be used to remove the stop etch layer and stop on a GaSb layer. Next, a second wafer bonding step joins the second GaAs/AlGaAs mirror to the active region, completing the laser cavity. The GaAs substrate associated with the second mirror can be removed using 30:1 $H_2O_2:NH_4OH$ etching, stopping on a high aluminum containing AlGaAs layer as a stop-etch. This leaves the entire laser cavity on a single GaAs substrate associated with the bottom mirror.

The use of optical pumping provides other advantages beyond RTCW operation. As has been demonstrated in NIR VCLs, optically pumped VCL cavities can often achieve wider tuning range than their electrically pumped counterparts. An embodiment of the present invention therefore also provides for a tuning mechanism accompanying the optically pumped VCL structure disclosed here. In the preferred embodiment, the VCL comprises a fixed half-VCL comprising a fixed mirror and the active region, and a second movable mirror separated by a variable gap from the fixed half-VCL. The movable mirror is actuated by a microelectromechanical system (MEMS). We note that the term "gap" is defined here to be broad enough to mean any gap that contains no solid material, but may contain air, a vacuum, or any number of gases.

Figure 3:
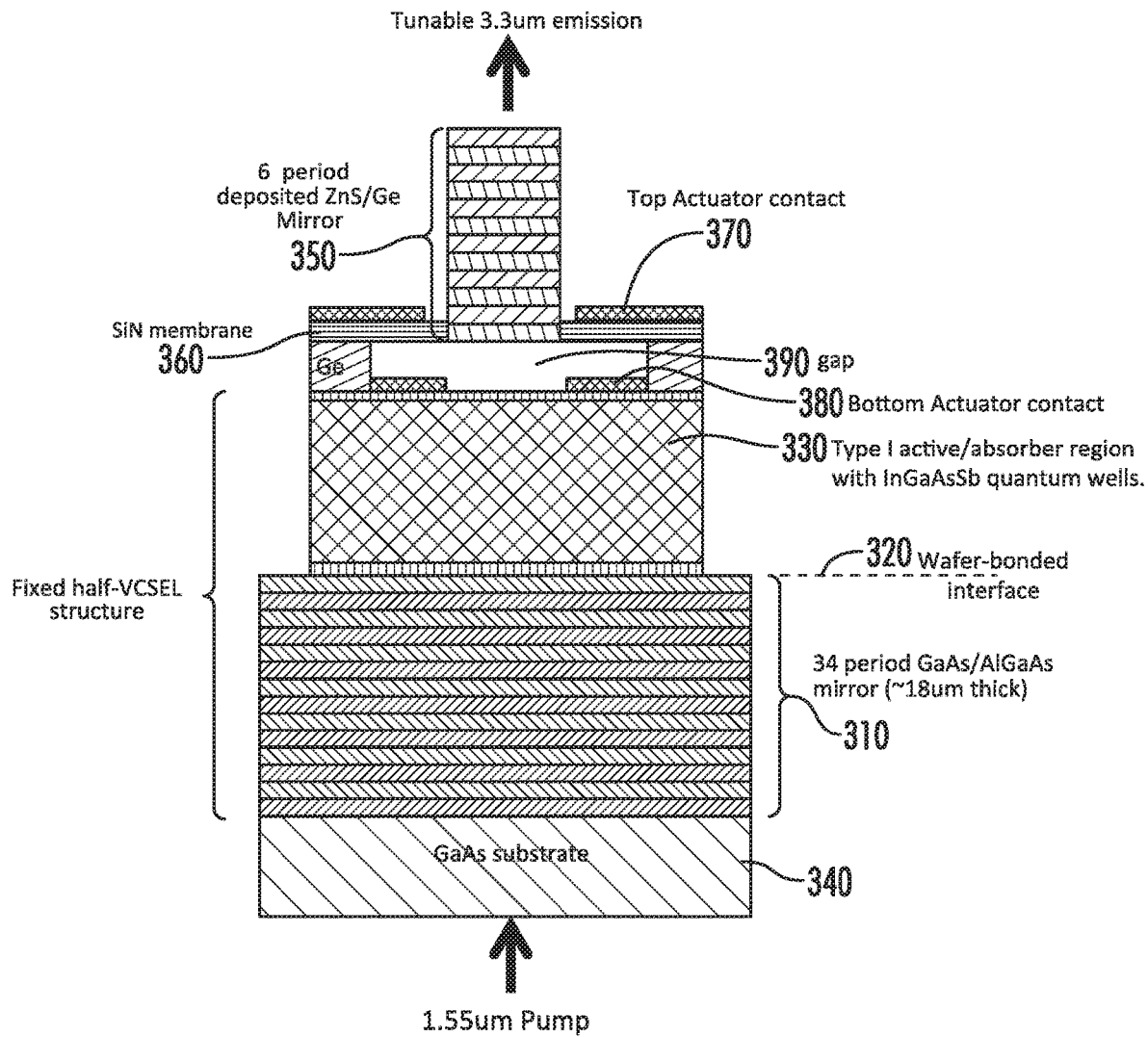
FIG. 3 shows a preferred embodiment of the present invention including a MEMS-tunable structure.

This MEMS tuning mechanism can give a tuning range exceeding 10% of the center wavelength at NIR, and may provide similar performance at mid-IR. The MEMS tuning mechanism can be configured to operate in a fixed manner, or for stepwise tuning, or continuous sweeping, or repetitive sweeping with a repetition rate from DC to greater than 1 MHz. FIG. 3 illustrates a preferred embodiment of the periodic gain type I optically pumped MEMS-tunable VCL. As shown, a fixed bottom mirror 310 is composed of GaAs/AlGaAs and joined at a wafer-bonded interface 320 to a type I periodic gain active region 330 comprising InGaAsSb quantum wells as described above. A 1550 nm pump beam enters through the GaAs substrate 340 and bottom GaAs/AlGaAs mirror 310, and is absorbed in the type I active region 330. The top mirror 350 is disposed on a Silicon nitride (SiN) membrane 360, and is composed of deposited materials. The SiN membrane 360 includes an aperture, such that no SiN is in the optical path. In one preferred embodiment, the top mirror 350 includes alternating layers of ZnS and Ge. Alternate preferred materials for the top mirror include ZnSe, $ThF_4$, and $CaF_2$. In yet another alternate embodiment, the top mirror could be GaAs/AlGaAs and the membrane GaAs instead of silicon nitride. Ideally, the top mirror should have a reflectivity in the range of 99% to 99.9%, and a roundtrip loss of less than 0.2%. Application of a voltage between a top contact 370 integral with the flexible membrane and a bottom contact 380 integral with the fixed half-VCL causes contraction of the gap 390 and tuning to shorter wavelengths. During the fabrication, the gap is occupied with a sacrificial layer, such as polyimide, silicon, or germanium, as is well-known to those skilled in the art of MEMS, and the sacrificial layer is released near the end of the fabrication process to create the gap and suspended structure. The fabrication of the MEMS actuator shown in FIG. 3 is very similar to MEMS actuators in the near-infrared. Key fabrication steps are well-known to those skilled in the art of MEMS-VCSELs, and are described for example in chapter 23 of "Optical Coherence Tomography: Principles and Applications," by Wolfgang Drexler and James Fujimoto, $2^{nd}$ edition, 2015.

Although the MEMS tuning mechanism of FIG. 3 provides a wide tuning range, alternate tunable structures are possible, such as thermal tuning by an integrated resistive heater, or by variation of pump power, as shown in FIG. 2C. An additional approach is the use of a second mirror that is detached from the half-VCL and is either fixed or movable depending on the tuning requirements. One specific case would be the use of an optical fiber as the second movable mirror, attached to a transducer such as a piezoelectric translator to effect the tuning. This optical fiber would have an appropriate highly reflective optical coating on the fiber end face that acts as the movable mirror.

Figure 4:
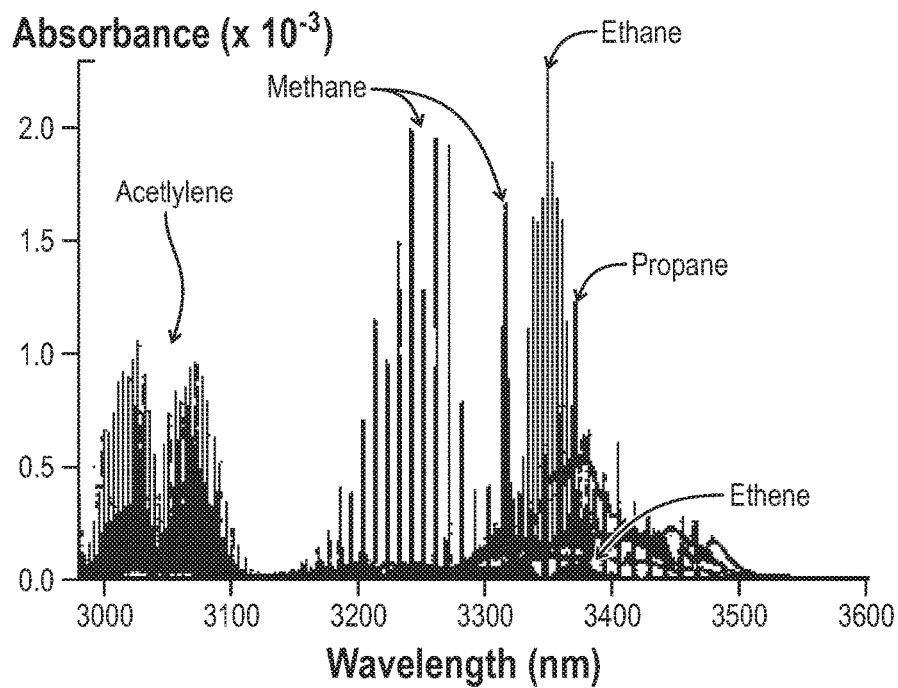
FIG. 4 shows absorption lines of several industrially and environmentally important gases in a range of 3000-3600 nm.
Figure 5:
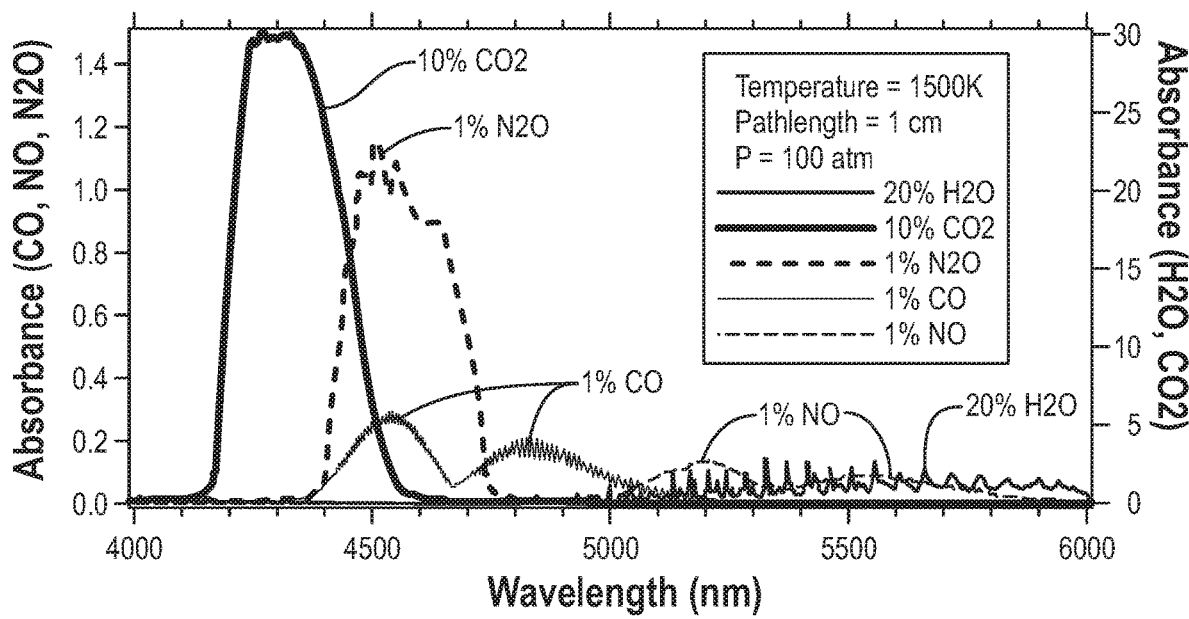
FIG. 5 shows pressure-broadened absorption spectra of several gases important in combustion in a range of 4500-6000 nm.

The tunable VCL according to an embodiment of the present invention can be incorporated into a number of spectroscopic detection systems. Such systems can be configured to detect a variety of properties of a liquid, solid, or gas sample. Examples include concentration of environmentally and industrially important gases such methane, ethane, ammonia, carbon dioxide, water vapor, HF vapor, nitrous oxide, acetylene, carbonyl sulfide, dimethyl sulfide, hydrogen cyanide, ozone, and carbon monoxide. FIGS. 4 and 5 illustrate the spectral dependence of the absorption of several of these gases, including pressure-broadened spectra of gases important in combustion in FIG. 5. A common way of measuring gas concentration is to measure the spectral dependence of tuned laser emission transmitted through a gas using an optical detector, and compare with the spectral dependence of light incident on the gas. Absorption lines will manifest as dips in the transmitted spectrum and the magnitude of these dips can with appropriate signal processing be related to the concentration of the gases of interest. Optical spectroscopy using the VCL of an embodiment of the present invention can measure any change in wavelength dependence of optical emission from the VCL after interaction with a sample, including but not limited to changed spectral dependence of intensity, polarization, phase, or other parameters, and relate that change to a property of the sample. Interaction with a sample can also take multiple forms, including but not limited to transmission, reflection, or scattering. In general, tunable emission from a VCL according to an embodiment of the present invention will have a first spectral dependence, which will change to a transformed spectral dependence upon interaction with a sample of interest. Quantifying the transformed spectral dependence relative to the first spectral dependence with an optical detector and appropriate signal processing, well-known to those skilled in the art of optical spectroscopy, can be used to determine properties of a sample of interest. This analysis can be fed back to optimize another system. For example a VCL based spectroscopy system according to an embodiment of the present invention can monitor gas concentration in a combustion system, and feed back to the combustion engine to optimize for example fuel efficiency.

Figure 6:
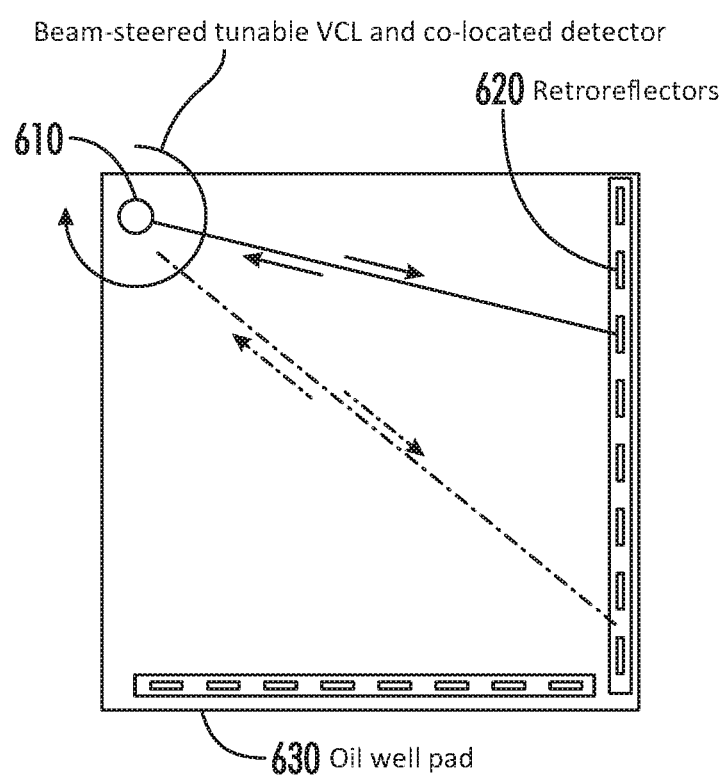
FIG. 6 shows an optical spectroscopy system according to an embodiment of the present invention capable of measuring gas concentration as a function of spatial location.

Optical spectroscopy can be used along with techniques for spatial mapping to quantify properties of a sample as a function of spatial location. FIG. 6 shows an example, in which tunable emission from a VCL 610 according to an embodiment of the present invention is steered across an oil well pad 630 using, for example, conventional beam-steering mirrors. The beam traverses the entire oil well pad as it reflects off various retro-reflectors 620 and returns to an optical detector that is co-located with the beam-steered tunable VCL. Analyzing the detected optical power vs. time can quantify the spatial distribution of methane gas across the oil well pad, and be used to assess methane leaks. This information can be fed back to a shutoff valve to turn off or alter a gas flow in response to a detected leak. Other applications of the generic configuration of FIG. 6 could include spatial mapping and monitoring of toxic gases in public setting such as stadiums, parks, airports, or in volcanically active areas.

Note that the VCL capable of RTCW operation described by the present disclosure may be employed below room temperature and/or in pulsed mode depending on the application. Such a VCL would still fall under the scope of the present invention.

Note that the VCL of FIGS. 2A and 3 can be fabricated in array form to create higher power or multi-wavelength arrays, as has previously been demonstrated in NIR VCSELs.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. An optically pumped vertical cavity laser (VCL) optically pumped with a pump source at a pump wavelength and providing VCL emission at an emission wavelength, said VCL comprising:
   a first mirror,
   a second mirror, and
   a periodic gain active region, wherein said periodic gain active region comprises at least two type I quantum wells containing Indium, Arsenic, and Antimony, wherein said active region further comprising a barrier region adjacent to said type I quantum wells which is absorbing at said pump wavelength, and a hole-blocking cladding region adjacent to said barrier region, which is substantially transparent at said pump wavelength;

wherein said emission wavelength is in a range of about 3-5 um; and wherein at least one of said first and second mirrors is a wafer-bonded mirror joined to said periodic gain active region at a wafer bonded interface, and comprises $Al(x)Ga(1-x)As$, with $0 \leq x \leq 1$, wherein said $Al(x)Ga(1-x)As$ is grown on a GaAs substrate.

2. The VCL of claim 1, wherein said type I quantum wells further contain Gallium.

3. The VCL of claim 1, wherein each of said quantum wells is compressively strained with a strain in a range of about 1-2%.

4. The VCL of claim 1, wherein said barrier region comprises quinary AlInGaAsSb.

5. The VCL of claim 1, wherein said hole-blocking cladding region comprises AlAsSb.

6. The VCL of claim 1, wherein said pump wavelength falls within one of the list of ranges from about 1.45-1.65 um, about 1.7-2.1 um, and about 0.95-1.15 um.

7. The VCL of claim 1, wherein both of said first and second mirrors are wafer-bonded mirrors joined to said periodic gain active region at a wafer bonded interface, and comprise $Al(x)Ga(1-x)As$, with $0 \leq x \leq 1$, wherein said $Al(x)Ga(1-x)As$ is grown on a GaAs substrate.

8. The VCL of claim 1, wherein said wafer-bonded interface comprises a plasma-activated bond between at least one of mirrors and said active region.

9. The VCL of claim 1, further comprising at least one interfacial oxide layer from the group including: Al2O3, SiO2, an oxide of Gallium, an oxide of arsenic, an oxide of Indium, and an oxide of Antimony, at said wafer-bonded interface.

10. The VCL of claim 1, comprising at least six type I quantum wells.

11. The VCL of claim 1, comprising multiple pairs of quantum wells, wherein each of said multiple pairs is disposed on a unique standing wave peak.

12. The VCL of claim 11, comprising exactly ten quantum wells.

13. The VCL of claim 1, further comprising a mechanism for tuning said emission wavelength to create a tunable emission over a wavelength tuning range.

14. The VCL of claim 13, wherein said tuning mechanism comprises thermal tuning.

15. The VCL of claim 14, wherein said thermal tuning is accomplished by changing a pump power of said pump source.

16. The VCL of claim 13, wherein said tuning mechanism comprises a MEMS tuning structure to change a dimension of a gap by moving a position of at least one of said first and second mirrors.

17. The VCL of claim 16, wherein said gap is evacuated to form a vacuum gap.

18. The VCL of claim 16, wherein said first mirror is a fixed mirror comprising $Al(x)Ga(1-x)As$, with $0 \leq x \leq 1$, and said second mirror is a deposited mirror disposed on a flexible membrane and separated from said active region by a gap.

19. The VCL of claim 16, wherein the tuning mechanism is designed to operate in one of the list of modes including: a fixed position, a stepwise manner, a continuous sweep manner, and a repetitive sweeping manner with a repetition rate.

20. The VCL of claim 19, wherein said repetition rate operates from fixed to high repetition rate in excess of 1 MHz.

21. A system for optical spectroscopy configured to probe an optical property of a sample, the system comprising a tunable laser emitting a tunable emission having a first wavelength dependence over a wavelength tuning range, said tunable emission interacting with said sample to create a transformed wavelength dependence, an optical detector for detecting said transformed wavelength dependence, and a means for converting said transformed wavelength dependence to a property of said sample, wherein said tunable laser is the VCL of claim 13.

22. The system of claim 21, further comprising a means for determining a spatial dependence of said property.

23. The system of claim 22, wherein said means comprises a beam steering mechanism to move said tunable emission.

24. The system of claim 21, wherein said sample is a gas.

25. The system of claim 21, wherein said sample comprises at least one gas from the group including: methane, ethane, ammonia, carbon dioxide, water vapor, HF vapor, nitrous oxide, acetylene, carbonyl sulfide, dimethyl sulfide, hydrogen cyanide, ozone, and carbon monoxide.

26. The system of claim 21, wherein said property is a concentration of one constituent.

27. The system of claim 26, wherein said property is a gas concentration.

28. The system of claim 27, further comprising a means for determining a spatial dependence of said gas concentration.

29. The system of claim 27, further comprising a means to shut off a gas flow in response to said gas concentration.

30. The system of claim 27, further comprising a means for feeding back to an engine combustion system to optimize a combustion process.

31. A system of claim 21, wherein said sample exists within a civil structure and its environs, wherein said civil structure is at least one from the group including: an airport terminal, a sports stadium, a park, and a large public space.

32. The VCL of claim 1, wherein one of said first and second mirrors is detached from said active region.

33. The VCL of claim 1, wherein one of said first and second mirrors is integral with an optical fiber.

34. The VCL of claim 1, wherein a near field spot size of said VCL emission is in a range of about 2.5-7 times said emission wavelength.

* * * * *